(12) United States Patent
Su et al.

(10) Patent No.: US 8,691,626 B2
(45) Date of Patent: Apr. 8, 2014

(54) SEMICONDUCTOR CHIP DEVICE WITH UNDERFILL

(75) Inventors: Michael Z. Su, Round Rock, TX (US); Lei Fu, Austin, TX (US); Gamal Refai-Ahmed, Markham (CA); Bryan Black, Spicewood, TX (US)

(73) Assignees: Advanced Micro Devices, Inc., Sunnyvale, CA (US); ATI Technologies ULC, Markham (CA)

( * ) Notice: Subject to any disclaimer, the term of this patent is extended or adjusted under 35 U.S.C. 154(b) by 358 days.

(21) Appl. No.: 12/878,812

(22) Filed: Sep. 9, 2010

(65) Prior Publication Data

US 2012/0061853 A1    Mar. 15, 2012

(51) Int. Cl.
*H01L 21/00* (2006.01)
*H01L 23/48* (2006.01)

(52) U.S. Cl.
USPC .......... 438/108; 438/110; 438/112; 257/778; 257/685; 257/893; 257/E21.503

(58) Field of Classification Search
USPC .......... 438/108, 110, 107; 257/778, E23.091, 257/E21.521, 777, E21.705, E25.01, 257/E23.023, E21.503, E21.532, 667, 257/E25.005, E25.012, E25.016, E25.02, 257/E25.026, 678–734, E23.001–E23.194, 257/787–793
See application file for complete search history.

(56) References Cited

U.S. PATENT DOCUMENTS

| | | | |
|---|---|---|---|
| 6,589,802 B1 * | 7/2003 | Asada et al. | 438/15 |
| 6,977,686 B2 * | 12/2005 | Shinomiya et al. | 348/340 |
| 7,198,980 B2 | 4/2007 | Jiang et al. | |
| 7,915,720 B2 * | 3/2011 | Tashiro et al. | 257/678 |
| 2001/0050441 A1 * | 12/2001 | Shivkumar et al. | 257/778 |
| 2003/0209837 A1 | 11/2003 | Farnworth | |
| 2004/0124513 A1 | 7/2004 | Ho et al. | |
| 2005/0167798 A1 | 8/2005 | Doan | |
| 2006/0207789 A1 * | 9/2006 | Soeta | 174/260 |
| 2007/0205501 A1 * | 9/2007 | Lee et al. | 257/704 |
| 2008/0081401 A1 * | 4/2008 | Shizuno | 438/123 |

FOREIGN PATENT DOCUMENTS

| | | | | |
|---|---|---|---|---|
| JP | 05160296 | | 6/1993 | |
| JP | 11-265909 | * | 9/1999 | H01L 23/29 |
| JP | 2000311905 | | 11/2000 | |
| JP | 2000357768 | | 12/2000 | |
| JP | 2009-158623 | * | 7/2009 | H01L 21/56 |
| JP | 2009158623 | | 7/2009 | |

OTHER PUBLICATIONS

PCT/US2011/051075 International Search Report mailed Dec. 27, 2011.

* cited by examiner

*Primary Examiner* — Jasmine Clark
(74) *Attorney, Agent, or Firm* — Timothy M. Honeycutt

(57) ABSTRACT

A method of manufacturing is provided that includes placing a removable cover on a surface of a substrate. The substrate includes a first semiconductor chip positioned on the surface. The first semiconductor chip includes a first sidewall. The removable cover includes a second sidewall positioned opposite the first sidewall. A first underfill is placed between the first semiconductor chip and the surface wherein the second sidewall provides a barrier to flow of the first underfill. Various apparatus are also disclosed.

21 Claims, 8 Drawing Sheets

SEMICONDUCTOR CHIP DEVICE WITH UNDERFILL

BACKGROUND OF THE INVENTION

1. Field of the Invention

This invention relates generally to semiconductor processing, and more particularly to multi-chip mounting structures and underfills and methods of assembling the same.

2. Description of the Related Art

A conventional type of multi-chip module includes two semiconductor chips mounted side-by-side on a carrier substrate or interposer. The semiconductor chips are flip-chip mounted to the interposer and interconnected thereto by respective pluralities of solder joints. The interposer is provided with plural electrical pathways to provide input/output pathways for the semiconductor chips both for inter-chip power, ground and signal propagation as well as input/output from the interposer itself. The semiconductor chips include respective underfill material layers to lessen the effects of differential thermal expansion due to differences in the coefficients of thermal expansion of the chips, the interposer and the solder joints.

A conventional method for fabricating the aforementioned conventional multi-chip module includes flip-chip mounting the first of the two semiconductor chips on the interposer and dispensing an underfill between the first mounted chip and the interposer. The underfill migrates laterally between the chip and the interposer and, upon thermal cure, produces a fillet that extends beyond the periphery of the semiconductor chip. Thereafter, the second semiconductor chip is flip-chip mounted to the interposer and a second underfill is positioned between the second mounted semiconductor chip and the interposer. Following a second thermal cure, the second underfill produces another fillet that extends beyond the periphery of the second semiconductor chip and typically abuts against the fillet of the first underfill of the first semiconductor chip.

A conventional set of design rules for manufacturing the aforementioned conventional multi-chip module has to account for the respective widths of the underfill material layer fillets. Thus, the fillets themselves present a constraint on the minimum permissible spacing between the two adjacent semiconductor chips. As with many aspects of semiconductor chip and package design, a constraint on the miniaturization of conductor structures, such as the conductive pathways between the semiconductor chips of the module, presents a limit on the amount of reduction in signal latency and perhaps power consumption due to resistive losses and other issues associated with line length.

The present invention is directed to overcoming or reducing the effects of one or more of the foregoing disadvantages.

SUMMARY OF EMBODIMENTS OF THE INVENTION

In accordance with one aspect of an embodiment of the present invention, a method of manufacturing is provided that includes placing a removable cover on a surface of a substrate. The substrate includes a first semiconductor chip positioned on the surface. The first semiconductor chip includes a first sidewall. The removable cover includes a second sidewall positioned opposite the first sidewall. A first underfill is placed between the first semiconductor chip and the surface wherein the second sidewall provides a barrier to flow of the first underfill.

In accordance with another aspect of an embodiment of the present invention, a method of manufacturing is provided that includes placing a removable cover on a surface of a substrate. The substrate includes a first semiconductor chip positioned on the surface. The first semiconductor chip includes a first sidewall and a second sidewall adjoining the first sidewall. The cover includes a third sidewall positioned opposite the first sidewall and a fourth sidewall positioned opposite the second sidewall. A first underfill is placed between the first semiconductor chip and the surface wherein the third sidewall and the fourth sidewall provide a barrier to flow of the first underfill.

In accordance with another aspect of an embodiment of the present invention, an apparatus is provided that includes a substrate that has a surface. A first semiconductor chip is positioned on the surface and includes a first sidewall. An underfill is positioned between the first semiconductor chip and the surface and includes a fillet that has a second sidewall facing away from the first sidewall. A second semiconductor chip is positioned on the surface and includes a third sidewall abutting the second sidewall.

In accordance with another aspect of an embodiment of the present invention, an apparatus is provided that includes a substrate that has a surface. A first semiconductor chip is positioned on the surface and includes a first sidewall. An underfill is positioned between the first semiconductor chip and the surface and includes a fillet that has a second sidewall facing away from and substantially parallel to the first sidewall. A second semiconductor chip is positioned on the surface and includes a third sidewall facing the second sidewall.

In accordance with another aspect of an embodiment of the present invention, an apparatus is provided that includes a substrate that has surface. A first semiconductor chip is positioned on the surface and includes a first sidewall. An underfill is positioned between the first semiconductor chip and the surface and includes a fillet that has a second sidewall facing away from and substantially parallel to the first sidewall. The underfill is positioned by placing a removable cover on the surface of the substrate wherein the removable cover includes a second sidewall positioned opposite the first sidewall, and placing the underfill between the first semiconductor chip and the surface wherein the second sidewall provides a barrier to flow of the first underfill. A second semiconductor chip is positioned on the surface and includes a third sidewall facing the second sidewall.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Various multi-chip stack arrangements are disclosed. Two or more semiconductor chips are stacked on a substrate, which may be a semiconductor chip, an interposer, a carrier substrate or something else. Prior to mounting the second semiconductor chip (and perhaps others), a removable cover is positioned on the interposer near a sidewall of the first mounted chip to act as a barrier to lateral flow of an underfill placed between the first mounted chip and the interposer. By constraining underfill fillet formation, chip-to-chip spacing can be reduced with attendant improvements in latency. Additional details will now be described.

Figure 1:
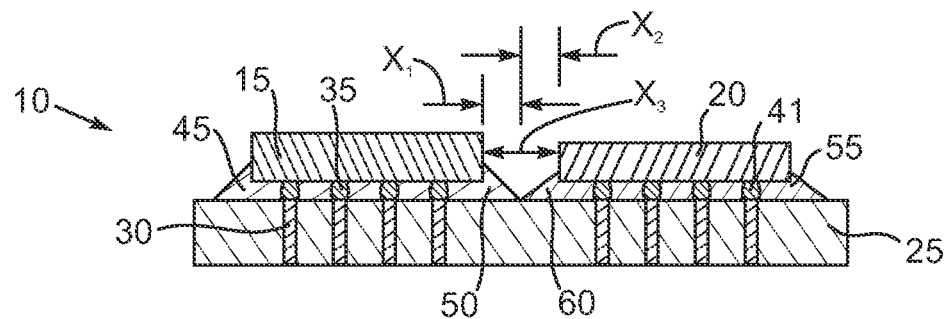
FIG. 1 is a sectional view of an exemplary conventional semiconductor chip device that includes two semiconductor chips mounted on an interposer.

In the drawings described below, reference numerals are generally repeated where identical elements appear in more than one figure. Turning now to the drawings, and in particular to FIG. 1 therein is shown a sectional view of an exemplary conventional semiconductor chip device 10 that includes two semiconductor chips 15 and 20 mounted on a substrate 25, which in the illustrative embodiment is an interposer, but which could be a carrier substrate or some other type of substrate. A plurality of thru-silicon vias (TSV) 30 are formed in the interposer 25 and may be connected to some form of input/output structure to enable the interposer 25 to electrically interface with some of the device (not shown). The semiconductor chip 15 may be electrically connected to some of the TSVs 30 by way of solder bumps 35 and the semiconductor chip 20 may be connected to others of the TSVs 30 by way of another group of solder bumps 40. The interposer 25 is sometimes constructed of silicon. To lessen the effects of differential CTE between the semiconductor chip 15 and the interposer 25, an underfill material 45 is introduced between the semiconductor chip 15 and the interposer 25. Typically, the dispensing of the underfill 45 is by way of capillary flow which leaves a fillet 50 that has some width $X_1$.

The space between the semiconductor chip 20 and the interposer 25 is similarly filled with an underfill 55 that has a fillet 60 with a lateral dimension $X_2$. The semiconductor chip 15 and the underfill 45 are typically positioned on the interposer 25 first and then one or more electrical tests are performed to verify the operation of both the semicondcutor chip 15 and the interposer 25. Thereafter, the semiconductor chip 20 and the underfill 55 are positioned on the interposer 25 and further electrical testing is performed. However, the lateral dimensions $X_1$ and $X_2$ of the fillets 50 and 60 constrain the minimum spacing $X_3$ between the semiconductor chips 15 and 20. Depending upon the magnitude of the minimum spacing $X_3$, electrical routing either in or within the interposer 25 to accommodate power, ground and signal between the chips 15 and 20 and the interposer 25 may be constrained.

Figure 2:
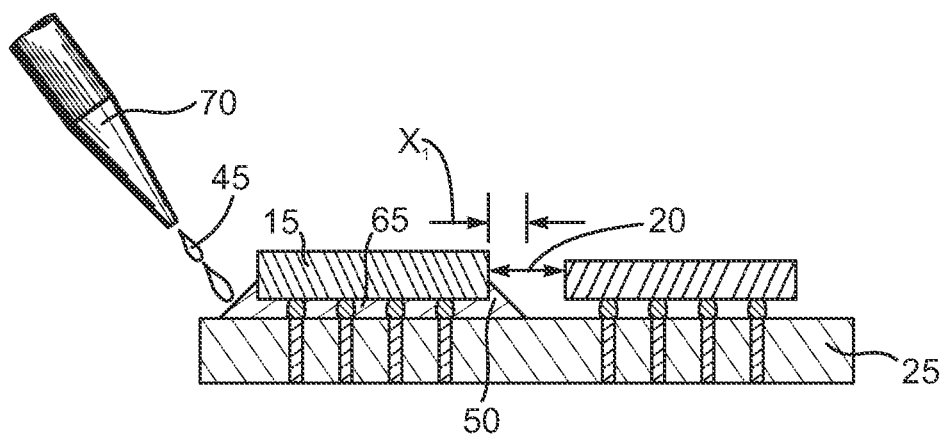
FIG. 2 is a sectional view like FIG. 1 depicting a conventional underfill dispensing beneath one of the semiconductor chips.
Figure 3:
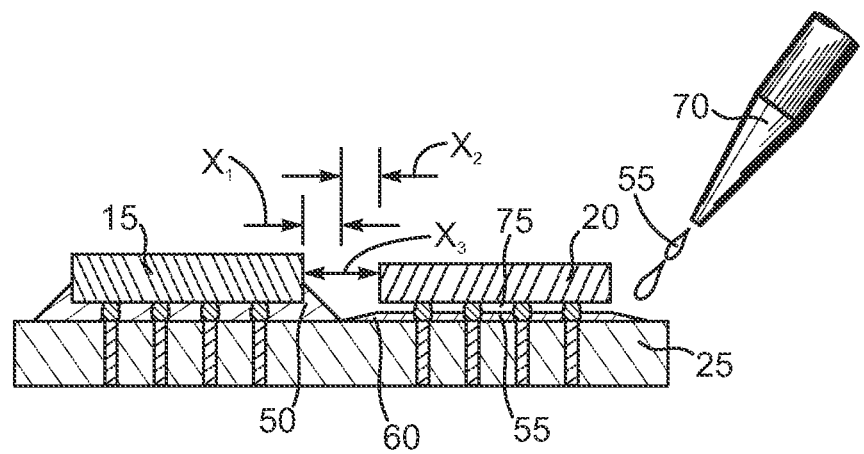
FIG. 3 is a sectional view like FIG. 2 depicting a conventional underfill dispensing beneath the other of the two semiconductor chips.

An exemplary conventional process for mounting the semiconductor chips 15 and 20 and the dispensing of the underfills 45 and 55 depicted in FIG. 1 may be understood by referring now to FIGS. 2 and 3, which are successive sectional views of the interposer 25 and the semiconductor chips 15 and 20 undergoing processing steps. Referring first to FIG. 2, the semiconductor chip 15 has been previously flip-chip mounted to the interposer 25. At this stage, the underfill 45 is dispensed by some suitable applicator 60 and capillary action used to disperse the underfill 45 into the gap 65 between the semiconductor chip 15 and the interposer 25. The underfill 45 is then subjected to a thermal cure which establishes the final width $X_1$ of the fillet 50. At this stage, the semiconductor chip 20 may also be flip-chip mounted to the interposer 25. If so, at this stage or at a later stage, the semiconductor chip 20 is mounted with the planned minimum spacing $X_3$ from the semiconductor chip 15. Next, and as shown in FIG. 3, the underfill 55 is dispensed in the gap 75 between the semiconductor chip 20 and the interposer 25 by way of the applicator 70. Ultimately, and subsequent to a thermal cure, the fillet 60 will set up with the lateral dimension $X_2$. Again, the minimum spacing $X_3$ is designed to accommodate the anticipated widths $X_1$ and $X_2$ of the respective fillets 50 and 60.

Figure 4:
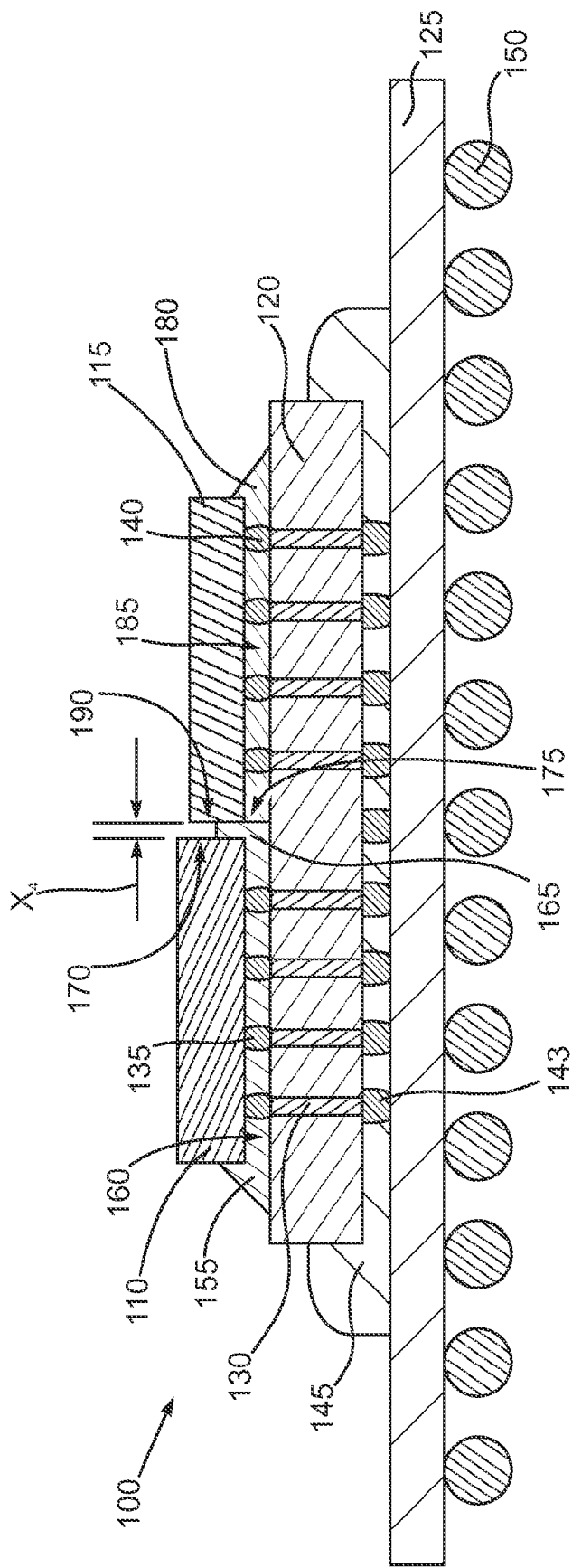
FIG. 4 is a sectional view of an exemplary embodiment of a semiconductor chip device that includes two semiconductor chips mounted on an interposer.

An exemplary embodiment of a semiconductor chip device 100 that provides for a much smaller minimum spacing between two semiconductor chips on an interposer may be understood by referring now to FIG. 4, which is a sectional view. The semiconductor chip device 100 includes semiconductor chips 110 and 115 mounted on an interposer 120. The interposer 120 may, in turn, be mounted to a circuit board 125, which may be a carrier substrate or circuit board of one sort or another. The mounting structures and techniques described herein are not limited to any particular types of semiconductor devices. Thus, the semiconductor chips 110 and 115 may be any of a myriad of different types of circuit devices used in electronics, such as, for example, microprocessors, graphics processors, combined microprocessor/graphics processors, application specific integrated circuits, memory devices, active optical devices, such as lasers, or the like, and may be single or multi-core or even stacked laterally with additional dice. Furthermore, one or both of the semiconductor chips 110 and 115 could be configured as an interposer with or without some logic circuits. Thus the term "chip" includes an interposer and vice versa. The semiconductor chips 15 and 155 may be constructed of bulk semiconductor, such as silicon or germanium, or semiconductor on insulator materials, such as silicon-on-insulator materials, or even other types of materials.

The interposer 120 may take on a variety of configurations. If typically configured, the interposer 120 may consist of a substrate of a material(s) with a coefficient of thermal expansion (CTE) that is near the CTE of the semiconductor chips 110 and 115 and that includes plural internal conductor traces and vias for electrical routing. Various semiconductor materials may be used, such as silicon, germanium or the like, or even insulator materials, such as silicon dioxide, tetra-ethyl-ortho-silicate or the like. Silicon has the advantage of a favorable CTE and the widespread availability of mature fabrication processes. Of course, the interposer could also be fabricated as an integrated circuit like the other semiconductor chips 110 and 115. In either case, the interposer 120 could be fabricated on a wafer level or chip level process. Indeed, one or the other of semiconductor chips 110 and 115 could be fabricated on either a wafer or chip level basis, and then singulated and mounted to the interposer 120 that has not been singulated from a wafer.

To electrically interface with the semiconductor chips 110 and 115 and the circuit board 125, the interposer 120 may be provided with plural TSVs 130. The TSVs 130 may be accompanied by multi-level metallization structures that consist of plural lines and traces and interconnecting vias as desired (not visible). Indeed, the electrical interface structures associated with the interposer 120 may take on a great variety of configurations. In this illustrative embodiment, the semiconductor chip 110 may be connected to the TSVs 130 by way of plural interconnect structures 135, which may be conductive bumps, conductive pillars, or the like. The semiconductor chip 115 may be similarly connected to some of the TSVs 130 by way of plural interconnect structures 140 which may be conductive bumps, conductive pillars, or the like. To electrically interface with the circuit board 125, the interposer 120 may be provided with plural input/output structures 143. The input/output structures 143 may be conductive bumps, conductive pillars, or the like. To lessen the detrimental effects of differential CTE between this interposer 120 and the circuit board 125, an underfill material 145 may be dispensed between the interposer 120 and the circuit board 125. The circuit board 125 may be provided with plural input/output structures to provide electrical interfaces with another circuit device such as another circuit board or other device (not shown). The input/output devices in this illustrative embodiment consist of a ball grid array of solder balls 150. However, virtually any other type of interconnect structures such as a pin grid array, a land grid array or any other type of interface structure may be used.

Similarly, the circuit board 125 may take on a variety of configurations. Examples include a semiconductor chip package substrate, a circuit card, or virtually any other type of printed circuit board. Although a monolithic structure could be used for the circuit board 125, a more typical configuration will utilize a buildup design. In this regard, the circuit board 125 may consist of a central core upon which one or more buildup layers are formed and below which an additional one or more buildup layers are formed. The core itself may consist of a stack of one or more layers. If implemented as a semiconductor chip package substrate, the number of layers in the circuit board 125 can vary from four to sixteen or more, although less than four may be used. So-called "coreless" designs may be used as well. The layers of the circuit board 125 may consist of an insulating material, such as various well-known epoxies, interspersed with metal interconnects. A multi-layer configuration other than buildup could be used. Optionally, the circuit board 125 may be composed of well-known ceramics or other materials suitable for package substrates or other printed circuit boards. The circuit board 125 is provided with a number of conductor traces and vias and other structures (not visible) in order to provide power, ground and signals transfers between the semiconductor chips 110 and 115 and another device, such as another circuit board for example.

To address the effects of differential CTE between the semiconductor chip 110 and the interposer 120, an underfill material 155 is dispensed in a gap 160 between the semiconductor chip 110 and the interposer 120. The underfill 155 includes only a relatively narrow fillet 165 proximate the sidewall 170 of the semiconductor chip 110. The fillet 165 may have a relatively vertical sidewall 175. The semiconductor chip 115 is similarly provided with an underfill 180 dispensed in the gap 185 between the chip 115 and the interposer 120. Due to the exemplary technique for positioning the underfills 155 and 180, the underfill 155 includes only the relatively narrow fillet 165 and the underfill 180 includes virtually no fillet proximate the sidewall 190 of the semiconductor chip 115. This has the benefit of enabling the semiconductor chips 110 and 115 to be positioned proximate one another with a very narrow spacing $X_4$. The much narrower spacing $X_4$ relative to, say the minimum spacing $X_3$ depicted in FIGS. 1, 2 and 3, can produce an attendant shortening of the electrical pathways associated with the interposer 120 and thus decrease latency and increase electrical performance. The underfills 145, 155 and 180 may be composed of well-known epoxy materials, such as epoxy resin with or without silica fillers and phenol resins or the like. Two examples are types 8437-2 and 2BD available from Namics.

Figure 5:
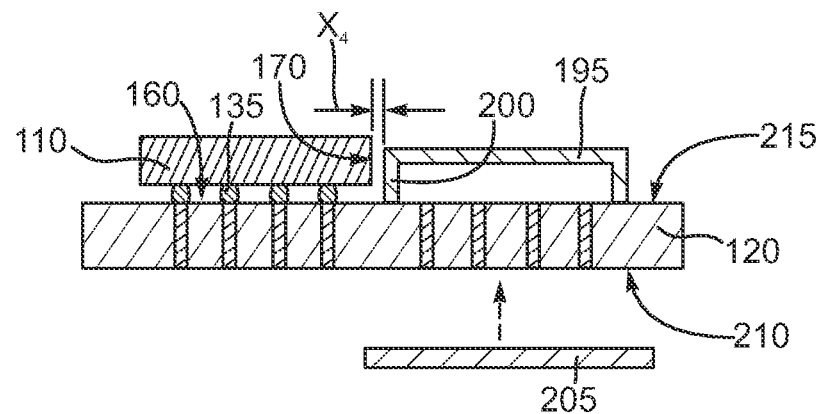
FIG. 5 is a sectional view of the exemplary interposer and a removable cover placed thereon.
Figure 6:
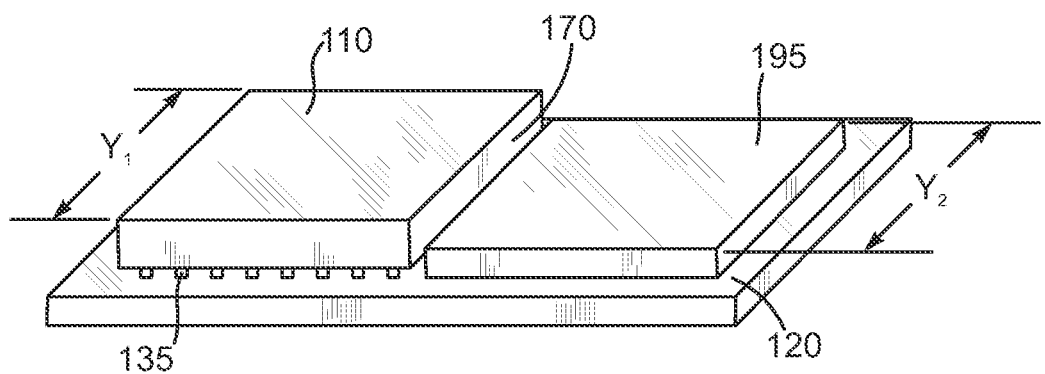
FIG. 6 is a pictorial view of the exemplary removable cover placed on the exemplary interposer.
Figure 7:
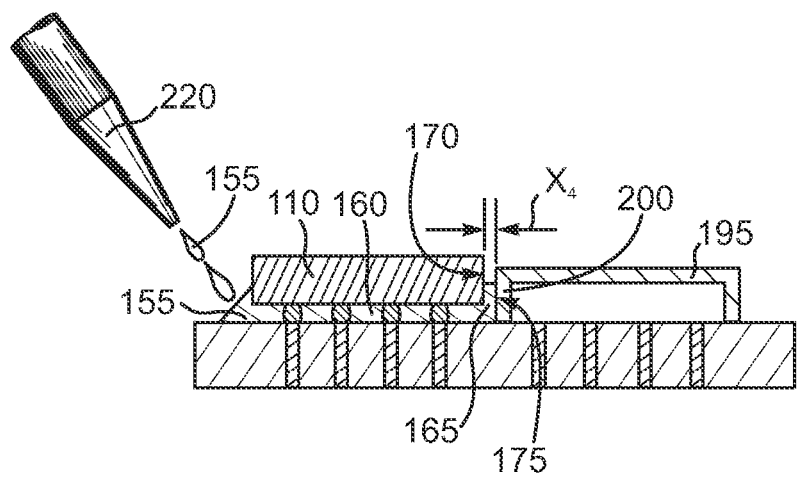
FIG. 7 is a sectional view like FIG. 5 but depicting placement of an underfill between a semiconductor chip and the interposer.

An exemplary method for mounting the semiconductor chip 110 to the interposer 120 and positioning the underfill 155 may be understood by referring now to FIGS. 5, 6 and 7 and initially to FIG. 5, which is a sectional view. FIG. 5 depicts the interposer 120 after the semiconductor chip 110 has been mounted thereto and electrically interfaced therewith by way of the interconnect structures 135. At this stage, the TSVs 130 may have already been established in the interposer 125 using well-known techniques. Depending upon the composition of the interconnect structures 135, the mounting of the semiconductor chip 110 to the interposer 120 may include a reflow process to temporarily liquefy any solder associated with the interconnect structures 135. At this stage, the gap 160 between the semiconductor chip 110 and the interposer 120 is open. To enable the subsequently dispensed underfill 155 depicted in FIG. 4 to set up with a relatively narrow fillet and with an optional, relatively vertical sidewall 170 as depicted in FIG. 4, a cover 195 is removably positioned on the interposer 120 with a lateral set off from the sidewall 170 of the semiconductor chip 110 that matches the preferred spacing $X_4$ between the semiconductor chips 110 and 115 as shown in FIG. 4. The cover 195 may be a simple box as depicted in FIG. 5 or any of a myriad of other arrangements as illustrated in subsequent figures. An important feature of the cover 195 is a sidewall 200 which faces toward the sidewall 170 of the semiconductor chip 110. The sidewall 200 acts as a barrier against the lateral migration of underfill away from the sidewall 170 of the chip 110. A variety of techniques may be used to hold the cover 195 in position during a subsequent application of the underfill material 155 depicted in FIG. 4. For example, the cover 195 may be merely held in place by its own weight. Optionally, the cover 195 may be constructed of a ferromagnetic material or materials and then held in position by way of a magnet 205, which may be a permanent magnet or electromagnet. The magnet 205 may be positioned against the lower surface 210 of the interposer 120 and used to pull the cover 195 toward the upper surface 215 of the interposer 120. The underfill 155 may have significant adhesive properties. Accordingly, the cover 195 may be coated with a suitable material, such as Teflon, to ease post underfill removal.

Additional details of the cover 195 may be understood by referring now also to FIG. 6, which is a pictorial view of the interposer 120, the semiconductor chip 110 and the cover 195. Note that a few of the interconnect structures 135 are visible. Here, the semiconductor chip 110 may have a dimension $Y_1$, which may be a length or a width. It is desirable for the cover 195 to have a corresponding dimension $Y_2$, which should be approximately equal to or perhaps greater than the lateral dimension $Y_1$ of the semiconductor chip 110. This selection of the dimension $Y_2$ will prevent the unwanted lateral migration of any underfill away from the sidewall 170 of the semiconductor chip 110 during dispensing and subsequent thermal curing.

Attention is now turned to FIG. 7, which is a sectional view like FIG. 5. With the cover 195 in position, the underfill 155 may be dispensed by way of a suitable applicator 220. The underfill 155 proceeds into the gap 160 by way of capillary action, but is constrained from movement beyond the sidewall 170 of the semiconductor chip 110 by way of the wall 200 of the cover 195. Thus, the underfill 155 will form with the fillet 165 of the desired lateral dimension $X_4$ and with the optional vertical sidewall 175. At this stage, a suitable curing process may be performed on the underfill 155 so that the fillet 165 sets up. The sidewall 175 is optionally substantially parallel to the sidewall 170 of the semiconductor chip 110.

Figure 8:
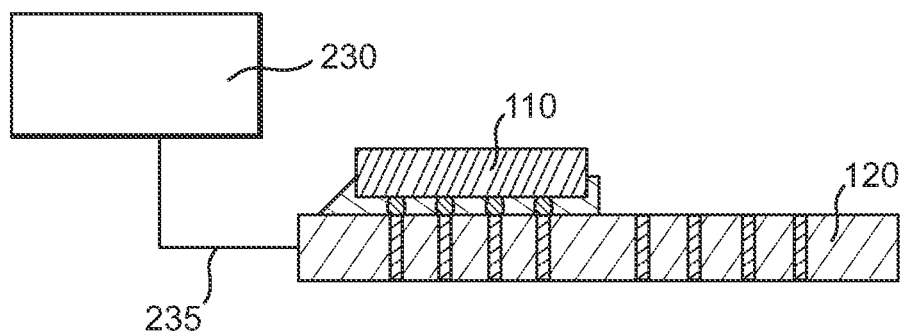
FIG. 8 is a sectional view like FIG. 7 but depicting the interposer with the removable cover removed and a testing device connected to the interposer.

Referring now also to FIG. 8, the cover 195 depicted in FIG. 7 may be removed and the semiconductor chip 110 and/or the interposer 120 subjected to electrical testing by way of a testing device 230. Here, the testing device 230 is shown schematically connected to the interposer 120 by way of connection 235. It should be understood that connection 235 is a schematic representation and may be a probe pin, plural probe pins, a socket connection on a circuit board or virtually any other type of electrical interface. Similarly, the test device 230 may be a computer, an application specific integrated circuit, or virtually any other diagnostic device used to test integrated circuits. A goal of the testing is to establish at this stage of processing whether or not the semiconductor chip 110 and/or the interposer 120 are defective. If the semiconductor chip 110 and/or the interposer 120 have defects at this stage, then either the semiconductor chip 110 and/or the interposer 120 may be reworked or scrapped as necessary.

Figure 9:
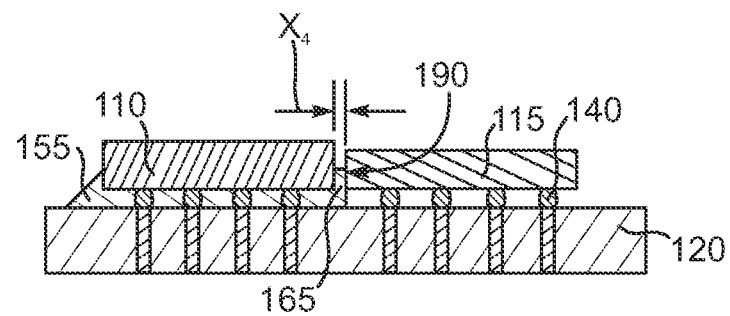
FIG. 9 is a sectional view like FIG. 7 but depicting mounting of another semiconductor chip on the interposer near the other semiconductor chip.
Figure 10:
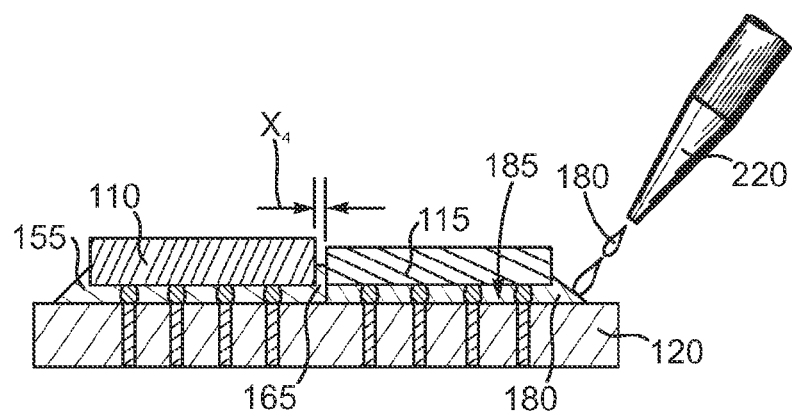
FIG. 10 is a sectional view like FIG. 9 but depicting placement of an underfill between the other semiconductor chip and the interposer.

Next, and as depicted in FIG. 9, the semiconductor chip 115 may be flip-chip mounted to the interposer 120 so that the sidewall 190 abuts the fillet 165 of the underfill 155. This establishes the aforementioned desired lateral dimension $X_4$ between the semiconductor chips 110 and 115. The interconnect structures 140 may be subjected to a reflow process if necessary depending upon the composition thereof. Next, and as depicted in FIG. 10, the underfill 180 may be dispensed in the gap 185 between the semiconductor chip 115 and the interposer 120 by way of the applicator 220. The underfill 180 proceeds along the gap 185 by way of capillary action until it abuts the fillet 165 of the underfill 155. At this stage, the interposer 120 and the semiconductor chips 110 and 115 may again be connected to the test device 230 depicted in FIG. 8 and electrical tests performed to establish the suitability of the semiconductor chip 115. In this way, not only is the desired short spacing $X_4$ established between the semiconductor chips 110 and 115, but additionally the reliability of the semiconductor chip 110 and the interposer 120 may be established prior to performing the steps and expending the materials associated with mounting the semiconductor chip 115.

Figure 11:
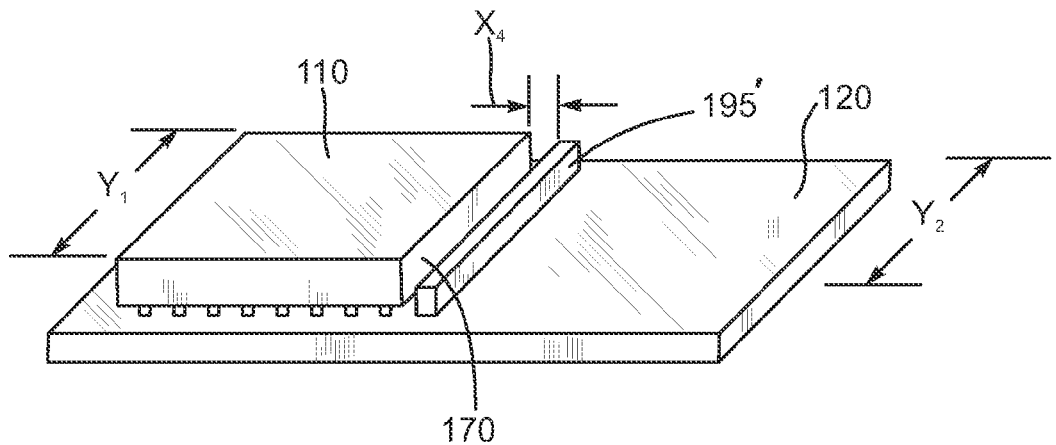
FIG. 11 is a pictorial view of an exemplary interposer and an alternate exemplary removable cover positioned thereon.

As suggested above, an important feature of the cover 195 depicted in FIGS. 4, 5, 6 and 7 is the sidewall 200 which acts as a barrier against the excessive lateral migration of the fillet 165 of the underfill 155. While that barrier feature is provided by way of a box in the illustrative embodiment of FIGS. 4, 5, 6 and 7, the skilled artisan will appreciate that a large variety of alternative structures may be used. For example, and as depicted in FIG. 11 pictorially, a cover 195' may be configured as a simple wall that has a lateral dimension $Y_2$ that matches or exceeds the lateral dimension $Y_1$ of the semiconductor chip 110. The cover 195' may be secured to the interposer 120 by way of any of the techniques disclosed therein. Again, the cover 195' will be offset laterally from the sidewall 170 of the semiconductor chip 110 by way of the desired spacing $X_4$.

Figure 12:
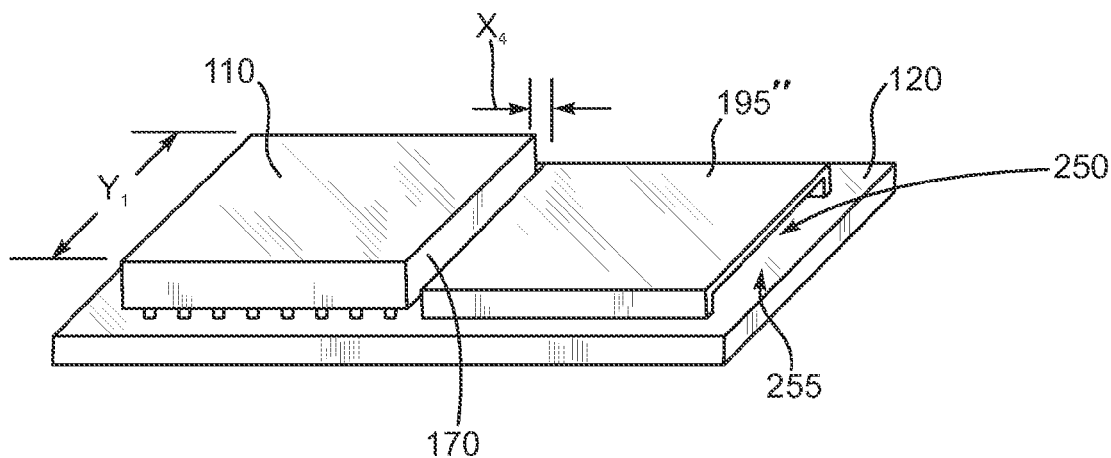
FIG. 12 is a pictorial view of an exemplary interposer and another alternate exemplary removable cover positioned thereon.

Another alternate exemplary embodiment of a cover 195" may be understood by referring now to FIG. 12 which is a pictorial view like FIG. 11. In this illustrative embodiment, the semiconductor chip 110 is mounted to the interposer as described elsewhere herein. However, the cover 195" in this illustrative embodiment is configured as a box-like structure with an open end 250. This type of arrangement may be desirable where, for example, there are surface mounted structures (not shown) in the vicinity of the region 255 of the interposer 120 that must be accounted for spatially. The cover 195" has a lateral dimension that matches or exceeds the lateral dimension $Y_1$ of the semiconductor chip 110. The cover 195" may be secured to the interposer 120 by way of any of the techniques disclosed therein. Again, the cover 195" will be offset laterally from the sidewall 170 of the semiconductor chip 110 by way of the desired spacing $X_4$.

Figure 13:
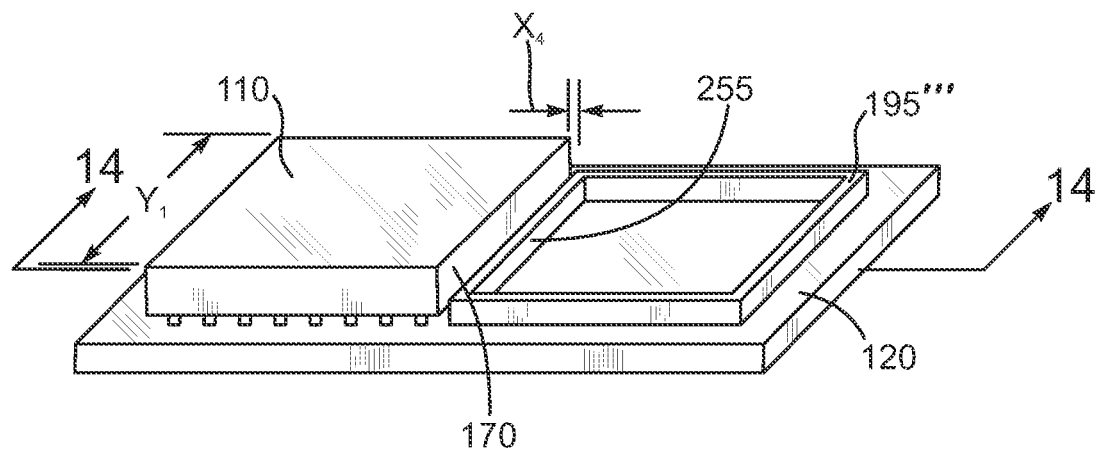
FIG. 13 is a pictorial view of an exemplary interposer and another alternate exemplary removable positioned thereon.

Another alternate exemplary embodiment of a cover 195''' may be understood by referring now to FIG. 13, which is a sectional view like FIG. 11. In this illustrative embodiment, the semiconductor chip 110 is shown mounted to the interposer 120. However, the cover 195''' in this illustrative embodiment is configured as a frame-like structure that includes a sidewall 255, which is designed to provide the aforementioned barrier against excessive lateral migration of underfill away from the sidewall 170 of the semiconductor chip 110. Again, the cover 195''' may be removably secured to the interposer 120 by any of the methods described herein. The cover 195''' has a lateral dimension that matches or exceeds the lateral dimension $Y_1$ of the semiconductor chip 110. The cover 195''' may be secured to the interposer 120 by way of any of the techniques disclosed therein. Again, the cover 195''' will be offset laterally from the sidewall 170 of the semiconductor chip 110 by way of the desired spacing $X_4$.

Figure 14:
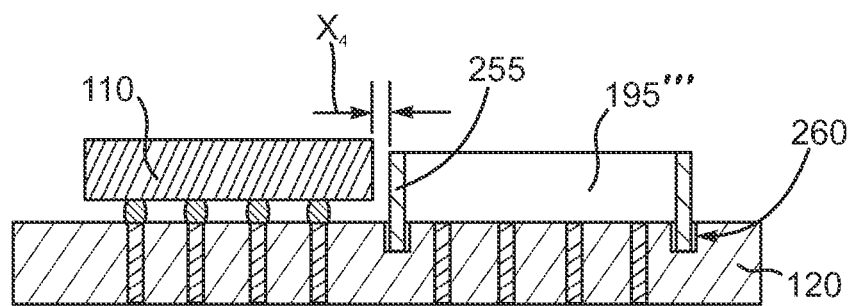
FIG. 14 is a sectional view of FIG. 13 taken at section 14-14.

The cover 195''' may be secured to the interposer 125 by modifying the structure of the interposer 120. In this regard, attention is now turned to FIG. 14, which is a sectional view of FIG. 13 taken at section 14-14. Here, the interposer 120 may be provided with a trench 260 that is formed with a suitable width sized to accommodate the thickness of the sidewall 255 of the cover 195'''. The trench 260 constrains lateral movement of the cover 195''' so that the preferred spacing $X_4$ is maintained even if forces are exerted on the cover 195''' during dispensing and/or curing of any underfill material. The trench 260 may be formed by various well-known material shaping techniques, such as well-known lithographic and etching techniques, laser ablation, or other material forming techniques. It should be understood that any of the disclosed embodiments of a cover 195, 195', 195" or others may be used in conjunction with a suitable trench 260.

Figure 15:
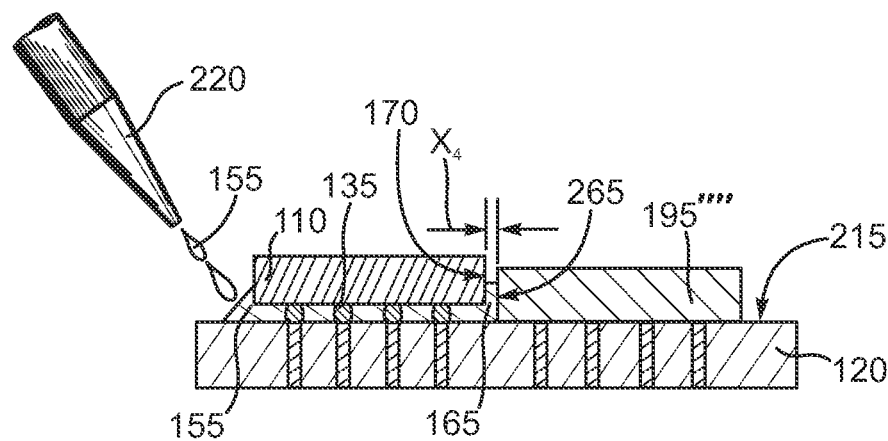
FIG. 15 is a sectional view like FIG. 7, but depicting exemplary underfill dispense using an alternate exemplary removable cover.

A technical goal of the disclosed embodiments is to utilize a cover that is removable from an interposer following the dispensing and curing of the underfill 155 for the semiconductor chip 110. In the foregoing disclosed embodiments, a cover is temporarily placed on an interposer and thereafter lifted off without destroying the integrity of the cover. However, the skilled artisan will appreciate that a suitable cover may be provided to supply the aforementioned barrier functionality by utilizing some form of material that may be dissolved or otherwise removed from an interposer. An exemplary method for utilizing such a cover may be understood by referring now to FIGS. 15 and 16 and initially to FIG. 15, which is a sectional view of the semiconductor chip 110 mounted to the interposer 120 and secured thereto by the interface structures 135 as generally described elsewhere herein. Here, an alternate exemplary cover 195'''' is applied to the surface 215 of the interposer 120 and set off laterally from the sidewall 170 of the semiconductor chip 110 by the preferred minimum spacing $X_4$. However, the cover 195'''' may be composed of a material or materials that can be either dissolved or otherwise removed from the interposer 120 using either a destructive or semi-destructive technique. Exemplary materials for the cover 195'''' includes for example negative tone photoresist, metastable materials that undergo phase change in response to stimulation, or even anodized carbon. The cover 195'''' may be applied as a relatively bulk film as depicted in FIG. 15. Following the dispensing of the underfill 155 by way of the applicator 220 and a suitable curing process, the aforementioned fillet 165 may be established that abuts a sidewall 265 of the cover 195''''.

Figure 16:
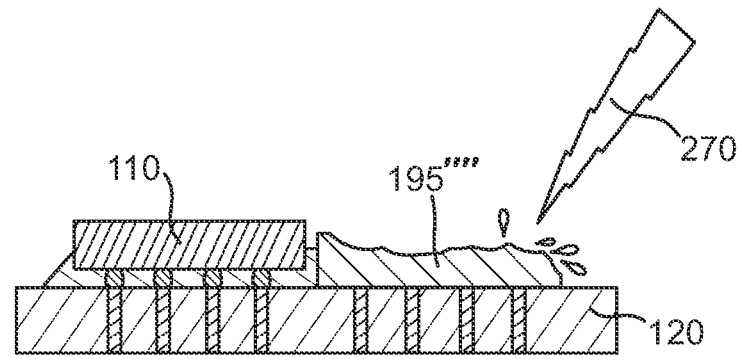
FIG. 16 is a sectional view like FIG. 15, but depicting exemplary removal of the removable cover by disintegration.

Next, and as shown in FIG. 16, the cover 195'''' may be subjected to a stimulation represented schematically by the symbol 270 in order to dissolve or otherwise break down the cover 195'''' in anticipation of the mounting of another semiconductor chip adjacent to the semiconductor chip 110. Here, the stimulation 270 may take on a variety of forms dependent upon the composition and sensitivity of the cover 195''''. For example, the stimulation 270 might be the introduction of a solvent or an etchant that is able readily break down the cover 195''''. If the cover 195'''' is composed of a phase change material then the stimulation might be, for example, radiation or some other stimulant that causes the material 195'''' to either break down on its own or by way of introduction of another solvent such as a photoresist developer or other material. After the cover 195'''' is removed, the interposer 120 may undergo the types of testing and the mounting of another semiconductor chip as described elsewhere herein.

Figure 17:
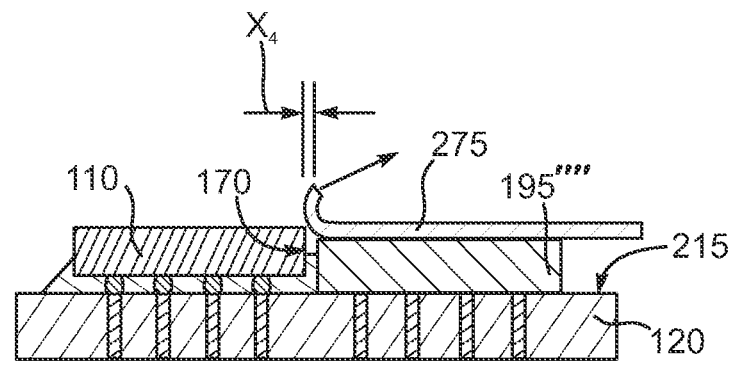
FIG. 17 is a sectional view like FIG. 16, but depicting exemplary removal of the removable cover by tape lift off.

In yet another alternative, the cover 195'''' may be lifted off of the interposer 120 by way of a suitable lift tape 275 as shown in FIG. 17. As with the other disclosed embodiments, the cover 195'''' may be applied to the surface 215 of the interposer 120 with the requisite lateral spacing $X_4$ from the sidewall 170 of the semiconductor chip 110. As the lift off tape 270 is pulled, the cover 195'''' may be lifted off of the surface 215 of the interposer 120. Thereafter, the interposer 120 and the semiconductor chip 110 may undergo electrical testing and the mounting of an additional semiconductor chip as described elsewhere herein.

Figure 18:
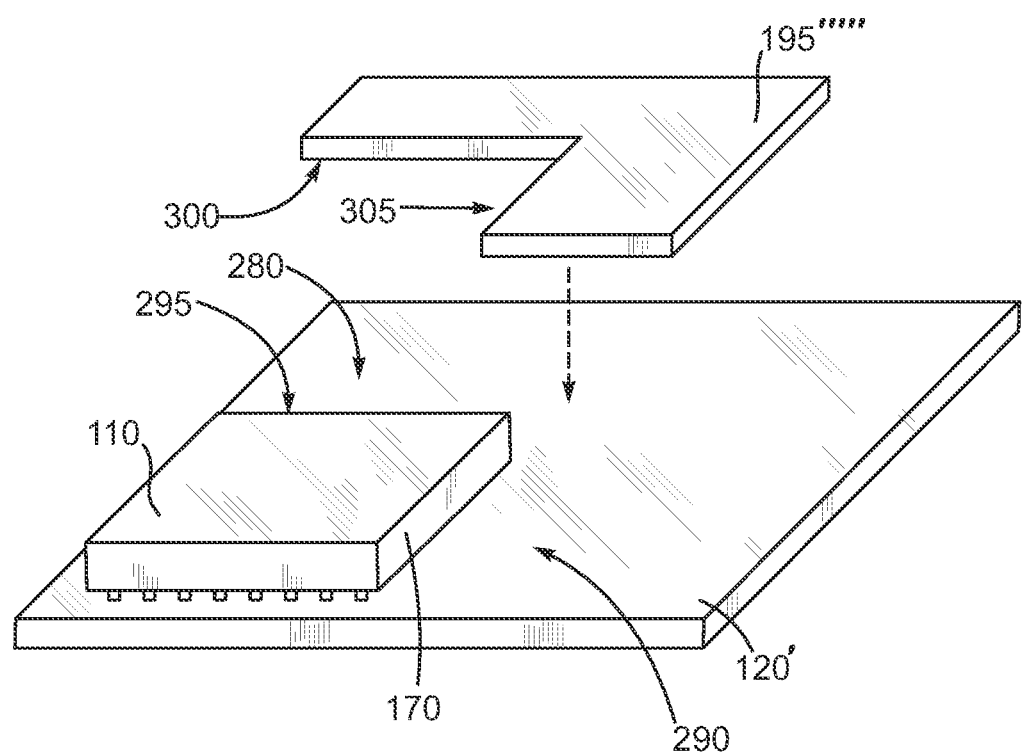
FIG. 18 is a pictorial view of an exemplary interposer adapted for more than two semiconductor chips placed side by side and an alternate exemplary removable cover with two sidewalls to constrain underfill flow.

Multi-chip devices may be configured with more than two semiconductor chips. In this circumstance, a suitable cover may be fashioned to enable the lateral constraint of underfill flowing from a given semiconductor chip into areas where additional semiconductor chips are slated to be mounted. An alternate exemplary embodiment incorporating such design features may be understood by referring now to FIG. 18, which is a pictorial view. Here, an interposer 120' has the semiconductor chip 110 mounted thereto. However, the interposer 120' has areas 280 and 290 slated for mounting of two or more semiconductor chips (not shown). Accordingly, it is desirable to be able to constrain any underfill from proceeding away from the sidewall 170 and an adjacent sidewall 295 of the semiconductor chip 110. Thus, a cover 195'''' may be fabricated with sidewalls 300 and 305 that are configured to face towards the sidewalls 295 and 170, respectively, of the semiconductor chip 110. In this way, underfill will be constrained by the presence of the sidewalls 300 and 305 during both underfill dispense and curing. Of course many other and more complex shapes may be used for the cover 195''''''. Any of the other features disclosed herein such as trenches and magnets, etc. may be used with this embodiment as well.

Any of the exemplary embodiments disclosed herein may be embodied in instructions disposed in a computer readable medium, such as, for example, semiconductor, magnetic disk, optical disk or other storage medium or as a computer data signal. The instructions or software may be capable of synthesizing and/or simulating the circuit structures disclosed herein. In an exemplary embodiment, an electronic design automation program, such as Cadence APD, Cadence Spectra, Encore or the like, may be used to synthesize the disclosed circuit structures. The resulting code may be used to fabricate the disclosed circuit structures.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of manufacturing, comprising:
placing a removable cover on a surface of a substrate, the substrate including a first semiconductor chip positioned on the surface, the first semiconductor chip including a first sidewall, the removable cover including a second sidewall extending at least to the surface and positioned opposite the first sidewall;
placing a first underfill between the first semiconductor chip and the surface wherein the second sidewall provides a barrier to flow of the first underfill; and
removing the removable cover and mounting a second semiconductor chip on the surface adjacent the first semiconductor chip.

2. The method of claim 1, wherein the removable cover is removed from the surface after the first underfill is placed.

3. The method of claim 2, wherein the removal comprises lifting or disintegrating the removable cover.

4. The method of claim 2, comprising performing an electrical test on the first semiconductor chip.

5. The method of claim 1, comprising removing the removable cover and mounting a second semiconductor chip on the surface adjacent the first semiconductor chip.

6. The method of claim 1, wherein the second semiconductor chip includes a third sidewall abutted against the first underfill.

7. The method of claim 6, comprising placing a second underfill between the second semiconductor chip and the surface.

8. The method of claim 1, wherein the substrate comprises a semiconductor chip.

9. The method of claim 1, wherein the substrate comprises one of a carrier substrate and an interposer.

10. A method of manufacturing, comprising:
placing a removable cover on a surface of a substrate, the substrate including a first semiconductor chip positioned on the surface, the first semiconductor chip including a first sidewall and a second sidewall adjoining the first sidewall, the cover including a third sidewall positioned opposite the first sidewall and a fourth sidewall positioned opposite the second sidewall, wherein the cover is partially surrounding the first semiconductor chip; and placing a first underfill between the first semiconductor chip and the surface wherein the third sidewall and the fourth sidewall provide a barrier to flow of the first underfill.

11. The method of claim 10, wherein the removable cover is removed from the surface after the first underfill is placed.

12. The method of claim 11, wherein the removal comprises lifting or disintegrating the removable cover.

13. The method of claim 11, comprising performing an electrical test on the first semiconductor chip.

14. The method of claim 10, comprising removing the removable cover and mounting a second semiconductor chip on the surface adjacent the first semiconductor chip.

15. The method of claim 10, wherein the substrate comprises one of a carrier substrate and an interposer.

16. An apparatus, comprising:
a substrate including a surface;
a first semiconductor chip positioned on the surface and including a first sidewall;
a removable cover positioned on the surface lateral to the first semiconductor chip, the removable cover including a first external sidewall extending at least to the surface and positioned opposite the first sidewall; and
a first underfill between the first semiconductor chip and the surface wherein the first external sidewall provides a barrier to flow of the first underfill.

17. The apparatus of claim 16, comprising a first underfill between the first semiconductor chip and the surface wherein the first external sidewall provides a barrier to flow of the first underfill.

18. The apparatus of claim 16, wherein the first semiconductor chip comprises a third sidewall and the removable cover comprises a second external sidewall positioned opposite to the third sidewall.

19. An apparatus, comprising:
a substrate including a surface;
a first semiconductor chip positioned on the surface and including a first sidewall; and
an underfill positioned between the first semiconductor chip and the surface and including a fillet having a second sidewall facing away from the first sidewall; and
a second semiconductor chip positioned on the surface and including a third sidewall abutting the second sidewall.

20. An apparatus, comprising:
a substrate including a surface;
a first semiconductor chip positioned on the surface and including a first sidewall; and
an underfill positioned between the first semiconductor chip and the surface and including a fillet having a second sidewall facing away from and substantially parallel to the first sidewall; and
a second semiconductor chip positioned on the surface and including a third sidewall facing the second sidewall.

21. An apparatus, comprising:
a substrate including a surface;
a first semiconductor chip positioned on the surface and including a first sidewall; and
an underfill positioned between the first semiconductor chip and the surface and including a fillet having a second sidewall facing away from and substantially parallel to the first sidewall, the underfill positioned by placing a removable cover on the surface of the substrate wherein the removable cover including a second sidewall positioned opposite the first sidewall, and placing the underfill between the first semiconductor chip and the surface wherein the second sidewall provides a barrier to flow of the first underfill; and
a second semiconductor chip positioned on the surface and including a third sidewall facing the second sidewall of the fillet.

* * * * *